United States Patent
Potlapalli et al.

(10) Patent No.: US 7,142,146 B2
(45) Date of Patent: Nov. 28, 2006

(54) METHOD AND SYSTEM FOR REDUCING INTERFERENCE BETWEEN ANALOG CIRCUITS OPERATING FROM A COMMON POWER SUPPLY

(75) Inventors: Yashovardhan R. Potlapalli, Durham, NC (US); Octavian Beldiman, Durham, NC (US)

(73) Assignee: Renesas Technology America, Inc., Durham, NC (US)

( * ) Notice: Subject to any disclaimer, the term of this patent is extended or adjusted under 35 U.S.C. 154(b) by 0 days.

(21) Appl. No.: 11/187,239

(22) Filed: Jul. 22, 2005

(65) Prior Publication Data

US 2006/0017601 A1    Jan. 26, 2006

Related U.S. Application Data

(60) Provisional application No. 60/590,249, filed on Jul. 22, 2004.

(51) Int. Cl.
*H03M 1/12*    (2006.01)
(52) U.S. Cl. .................................................. 341/155
(58) Field of Classification Search ................ 341/158, 341/159, 161, 162, 122, 155; 327/77, 78, 327/79, 63, 54, 55
See application file for complete search history.

(56) References Cited

U.S. PATENT DOCUMENTS

| | | | | | |
|---|---|---|---|---|---|
| 5,202,687 A | * | 4/1993 | Distinti | ...................... | 341/158 |
| 5,329,172 A | * | 7/1994 | Kohdaka | ...................... | 327/63 |
| 6,064,239 A | * | 5/2000 | Matsuoka | ..................... | 327/63 |
| 6,150,850 A | * | 11/2000 | Kinoshita | .................... | 327/77 |

\* cited by examiner

*Primary Examiner*—Brian Young
(74) *Attorney, Agent, or Firm*—Buchanan Ingersoll & Rooney PC

(57) ABSTRACT

In a system having multiple analog circuits that share a common power supply, where a change in the operational state of one circuit can have an effect on the performance of another circuit, a determination is made when any one of the circuits enters a state where its performance could be affected. Under such a condition, the other circuits that share the common power supply are placed in a state where their effect on the operation of the first circuit will be negligible. This state for the other circuits can be one of maximum current draw, so that subsequent operation by the other circuits will not alter the demands on the power supply.

7 Claims, 4 Drawing Sheets

METHOD AND SYSTEM FOR REDUCING INTERFERENCE BETWEEN ANALOG CIRCUITS OPERATING FROM A COMMON POWER SUPPLY

Reference is made to Provisional U.S. Patent Application No. 60/590,249, filed Jul. 22, 2004, the contents of which are incorporated herein by reference.

FIELD OF THE INVENTION

The present invention is directed to the operation of multiple independent analog circuits in a system, and more particularly to a method for ensuring consistent performance for one of the circuits in the presence of adverse effects due to changes in the state of other circuits sharing a common power supply.

BACKGROUND OF THE INVENTION

In a variety of electronic systems, there can be many analog circuits operating from the same power supply. One example of such a system is a micro-controller unit (MCU), in which the analog circuits are connected between analog power (AVDD) and analog ground (AVSS) terminals. The analog circuits, such as analog-to-digital converters, can be turned ON or OFF and will draw different amounts of current from the power supply. Due to parasitic resistances (or off chip components used to isolate the analog supply from a digital power supply), this change in current can change the effective supply voltage (AVDD−AVSS) seen at the analog blocks in an MCU.

In analog circuits, there are certain bias voltages that are only valid relative to the supply levels. For example, when a CMOS inverter is used as a comparator, its "bias" is the mid-rail voltage, i.e., (AVDD−AVSS)/2. After the bias voltage has been set, if there is any change in AVDD, the bias will no longer be accurate.

When other analog circuits that share the same power supply are turning ON and OFF, changes in the value of AVDD that is supplied to a given analog circuit can occur. As a result of these changes, the bias voltage for that circuit can be inaccurate. The performance of the circuit will depend on the state of the other circuits sharing the power supply. This is particularly undesirable in the case, for example, of an analog-to-digital converter, where the accuracy could change from one conversion to the next, depending on what other analog circuits are turned on or off.

BRIEF DESCRIPTION OF THE DRAWINGS

The accompanying drawings provide visual representations which will be used to more fully describe representative embodiments disclosed herein and provide a better understanding of the invention and its inherent advantages. In these drawings, like reference numerals identify corresponding elements, wherein.

DETAILED DESCRIPTION

Various aspects of the invention are described hereinafter in connection with exemplary embodiments, including certain aspects described in terms of sequences of actions that can be performed by elements of a computer system. For example, it will be recognized that in each of the embodiments, the various actions can be performed by specialized circuits or circuitry (e.g., discrete and/or integrated logic gates interconnected to perform a specialized function), by program instructions being executed by one or more processors, or by a combination of both.

To facilitate an understanding of the principles that underlie the invention, they are described hereinafter with specific reference to analog-to-digital converters (ADC) that utilize one or more chopper comparators. It will be appreciated that these embodiments are merely exemplary of a multitude of different types of analog circuits to which the principles of the invention can be applied, and therefore should not be viewed as limiting the invention in any manner.

Figure 1:
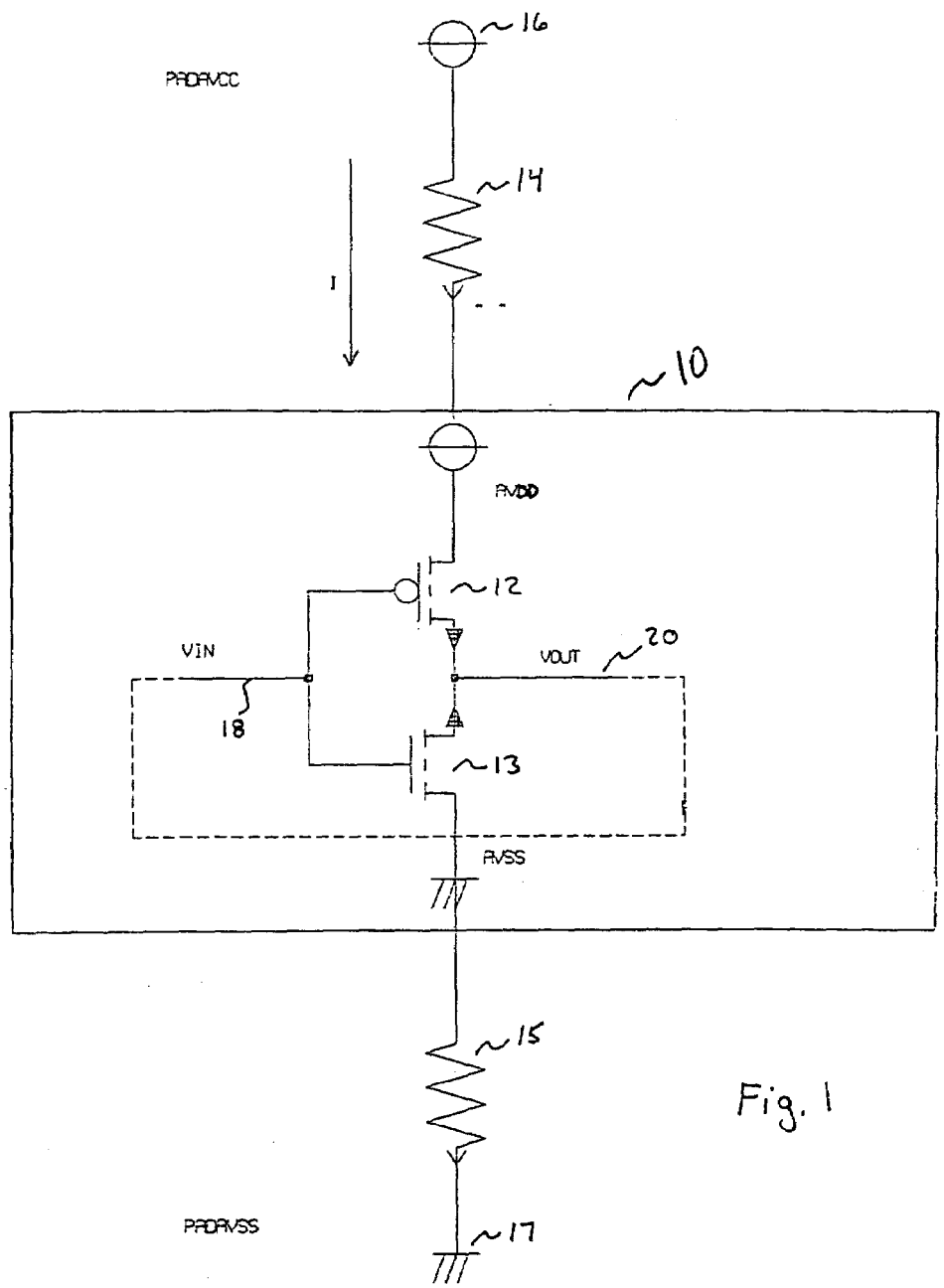
FIG. 1 illustrates an equivalent circuit of an analog-to-digital converter having a single chopper comparator.

FIG. 1 shows an equivalent circuit of a comparator used in a single chopper analog-to-digital converter 10 comprising a pair of complementary MOS transistors 12 and 13 connected in series between a power source AVDD and a ground reference potential AVSS. In the illustrated circuit, the comparator functions as an inverter. Resistors 14 and 15 are parasitic resistances associated with the power connections from the power supply pads 16 and 17 to the chopper circuit 10. The parasitic resistance for AVDD and AVSS may not be the same.

The current I is the current drawn by the comparator circuit 10 from the power supply. At the beginning of the conversion of an analog input signal, VIN, the comparator input terminal 18 is connected to its output terminal 20 via a switch (not shown), as represented by the dashed line in the figure. This operation is referred to as "nulling" the inverter, because once this action is completed, the chopper is biased such that any change in its gate voltage (VIN) will cause a large change in the output voltage (VOUT). The current drawn during the nulling phase is I_NULL and is the maximum current drawn by the chopper circuit.

At nulling, the voltage VIN (and VOUT) can be determined as follows. All voltages are defined with respect to the reference voltage PADAVSS at the ground pad 17.

For an ideal inverter, the voltage VIN is given by the equation:

$$VIN-AVSS=(AVDD-AVSS)/2 \qquad (1)$$

and therefore $$VIN=(AVDD+AVSS)/2 \qquad (2)$$

Assuming there is a current I_NULL flowing through the parasitic resistances 14 and 15, then:

$$AVSS=I\_NULL*R15 \qquad (3)$$

and $$AVDD=PADAVDD-I\_NULL*R14 \qquad (4)$$

where R14 and R15 are the resistance values of the parasitic resistances 14 and 15, respectively.

Replacing Equations (3) and (4) in Equation (2):

$$VIN=[PADAVDD+(R15-R14)*I\_NULL]/2 \qquad (5)$$

As long as the current is I_NULL, the nulling voltage VIN coincides with the ideal bias voltage for the inverter VBias=

(AVDD−AVSS)/2, so that the inverter operates in the middle of its linear voltage characteristics. However, if the current changes, the ideal bias voltage will change accordingly, while the nulling voltage VIN cannot be changed without another nulling phase. For example, if there is no current flowing through the parasitic resistances, the ideal bias voltage will be VBias=PADAVDD/2, while the actual bias point (set during the nulling phase) is VIN=[PADAVDD+ (R15−R14)*I_NULL]/2, according to Equation (5). Hence, the performance of the comparator depends on the current drawn from the power supply. In particular, other analog circuits sharing the power supply may affect the performance of the comparator.

If the values for R14 and R15 are equal, the nulling voltage will coincide with the ideal bias voltage, independent of current. However, typically R14 and R15 are not equal.

After the nulling phase is completed, the conversion phase can start. In this phase, there are several successive approximation stages in which an ADC ladder generates a series of reference voltages that are sequentially compared to VIN, to get to a closer approximation of the analog voltage. An example of the structure and operation of such a ladder is described in U.S. Pat. No. 6,100,837, the disclosure of which is incorporated herein by reference. The effect at the gate of the inverter can be to bring VIN back again to the value set at the end of nulling phase.

For example, if the initial analog voltage VIN at sampling (and nulling) was 0V, the ladder would go though VREF/2, VREF/4, VREF/8 and so on, until the ladder reaches VREF/ 1024 (e.g., for a 10-bit ADC). The effect of the ladder going though each of these voltages can be to have VIN compared with the values AVDD, 3AVDD/4, 5AVDD/8 and so on, until it reaches AVDD/2+AVDD/1024.

Figure 2:
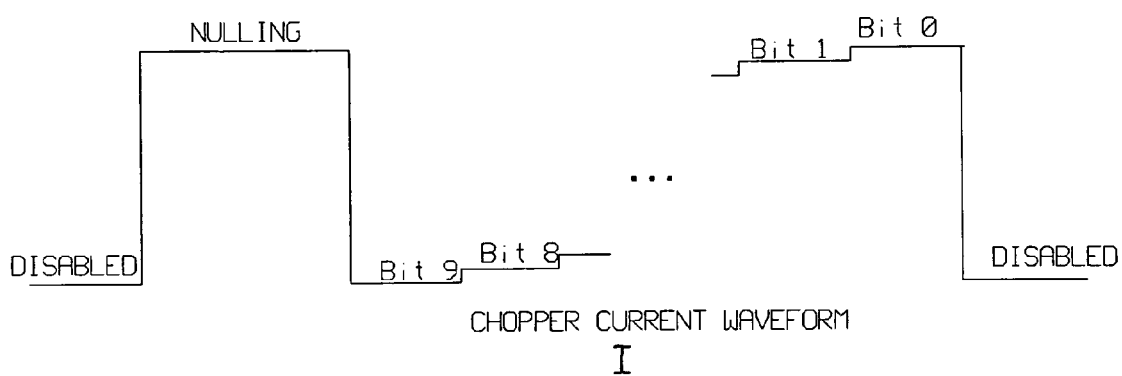
FIG. 2 illustrates exemplary current waveforms resulting from applying the techniques described.

The current waveform though the entire process described above is shown in FIG. 2. As can be seen from the figure, the current I is changing during the process. As described above, this change in current can be problematic. However, the error introduced as a result of the parasitic resistances 14 and 15 will be small for small currents, but it may affect the last few comparisons, for the least significant bits. In other words, the error can have an effect only in the last few comparisons. However, by the time the last few comparisons are made, the current can be almost the same as I_NULL, and so the error becomes negligible.

Figure 3:
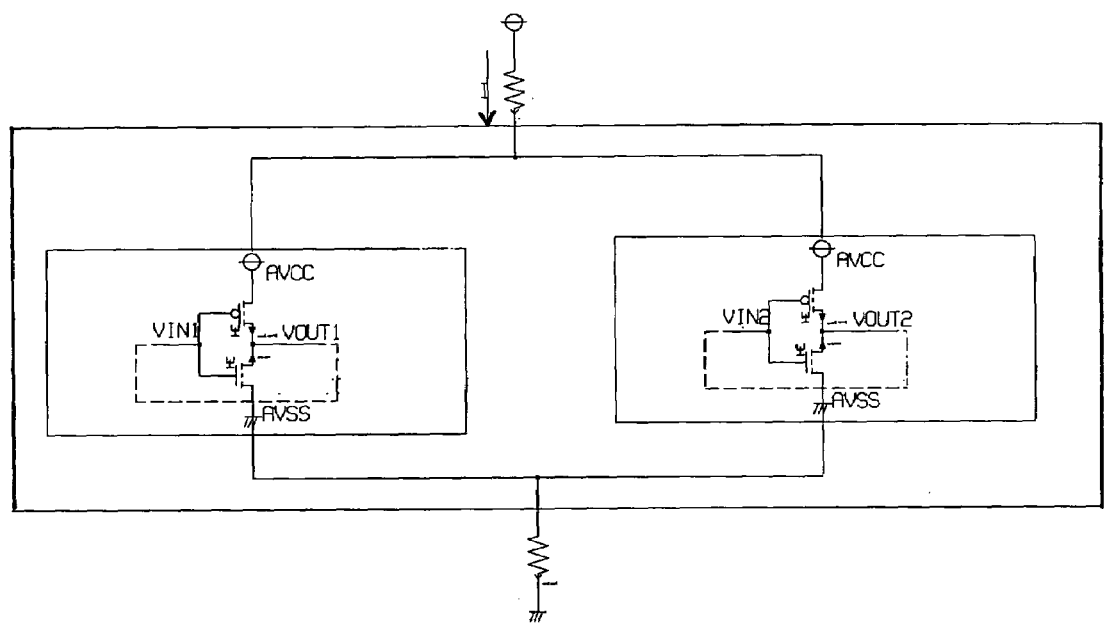
FIG. 3 illustrates an arrangement including two chopper circuits.

A circuit containing two choppers (e.g., for supporting two conversions in parallel) is shown in FIG. 3. A default implementation may be where each chopper is enabled only when it is used (triggered). After the first chopper samples (and nulls) and then starts converting, a trigger for the second chopper can arrive and also start it sampling (and nulling). During the last few comparisons of the first chopper, the current I, instead of being about I_NULL, will be about 2*I_NULL (since each of the first and the second choppers is operating). Based on the description above, the voltage at VIN of the first chopper may no longer be accurate, and the conversion result can have an offset.

During the conversion phase of the second chopper, if the first chopper is not being used, it can be shut down per a default implementation. As the second chopper nears the last few comparisons, the current I, instead of being 2*I_NULL as it was during the sampling (nulling) phase, will only be around I_NULL. Again, the voltage at VIN of the second chopper will no longer be accurate and the conversion result can have an offset error.

A solution to this problem can be to identify other circuit blocks that can turn on during the operation of a specific analog circuit with like bias voltages, and ensure the other blocks stay in a same state during the entire operation of the specific analog circuit. However, this approach can be impractical, since it would prevent the second chopper from turning on until after the first chopper has completed its operation. Another, more preferred approach is to turn all the other analog blocks into their normal on (current drawing) state so that there can be no current change (and thus change in effective supply) for the specific analog circuit.

To account for both scenarios described above, in accordance with the preferred approach the second chopper is enabled and then nulled as soon as the first chopper starts sampling (and nulling). In addition, the first chopper can be nulled during the comparison phase of the second chopper. This ensures that the current drawn remains substantially the same during both sampling (and nulling) and comparison phases of both the first and second choppers.

Figure 4:
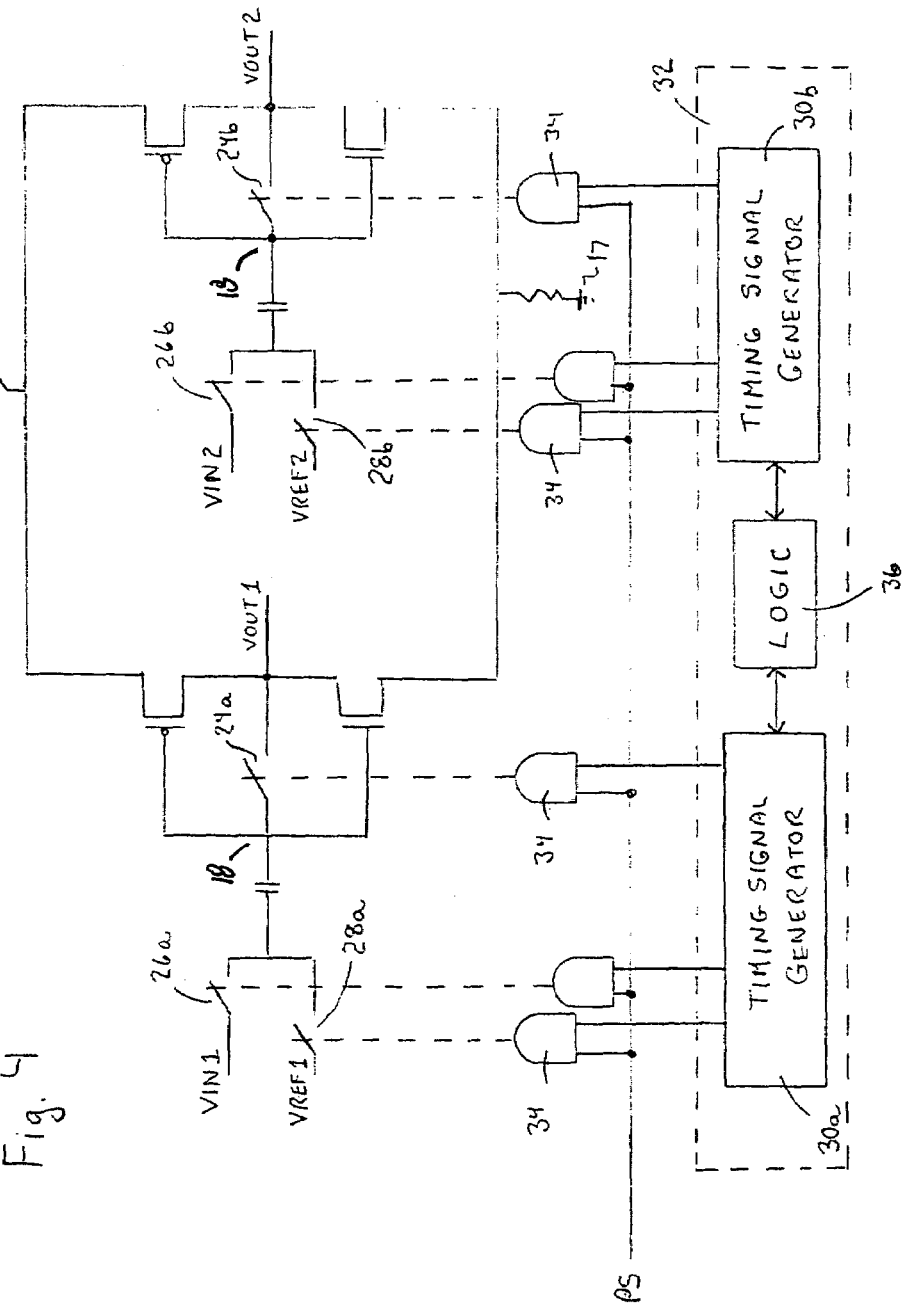
FIG. 4 is a schematic diagram of an analog circuit system that embodies the present invention.

One example of a circuit for accomplishing this result is illustrated in FIG. 4. As described in greater detail in the previously-cited '837 patent, timing signals are used to control the nulling switch 24 as well as switches 26 and 28 that selectively apply the VIN and VREF signals to the input terminal 18 of each chopper. These timing signals are generated by a respective timing signal generator 30 for each chopper, which could be implemented in the controller 32 of an MCU or other system in which the chopper circuits are embodied. In the illustrated embodiment, each chopper is enabled by AND gates 34 that selectively apply the timing signals to the switches 24–28 of the choppers. All of the AND gates are enabled by a common signal PS, so that when any chopper is enabled, all of the choppers are enabled.

In accordance with the present invention, a logic circuit 36 can be associated with the timing signal generators to detect when any one of the chopper circuits is in a nulling or comparison state, and place each other chopper in a nulling state to thereby maintain a substantially uniform voltage supply for all of the choppers during the operation of any one of them. For instance, as soon as a signal is generated by the timing signal generator 30a to close the nulling switch 24a of the first chopper, the logic circuit can detect this signal and send a signal to the other timing signal generator 30b to close the nulling switch of the second chopper. After the operation of the first chopper has ceased, if the logic circuit detects that a signal is being sent to the nulling switch 24b or the switch 28b of the second chopper to perform a comparison, the timing signal generator 30a of the first chopper can be alerted to close the nulling switch 24a, to maintain a current draw through each chopper.

Although depicted as a separate circuit in FIG. 4, the logic circuit can be incorporated within the timing signal generators, and be implemented in either a software or hardware form.

In accordance with the present invention, therefore, in a system having multiple analog circuits that share a common power supply where a change in the operational state of one circuit can have an effect on the performance of another circuit, a determination is made when any one of the circuits enters a state where its performance could be affected. Under such a condition, the other circuits that share the common power supply are placed in a state where their effect on the operation of the first circuit will be negligible. In the disclosed implementation, this state for the other circuits is one of maximum current draw, so that subsequent operation by the other circuits will not alter the demands on the power supply.

It will be appreciated by those of ordinary skill in the art that the concepts and techniques described herein can be embodied in various specific forms without departing from the essential characteristics thereof. The presently disclosed embodiments are considered in all respects to be illustrative and not restrictive.

What is claimed is:

1. A system comprising:
   a first analog circuit whose performance can be affected by changes in the level of power supplied thereto;
   a second analog circuit whose performance can be affected by changes in the level of power supplied thereto;
   a power supply that supplies power in common to each of said first and second analog circuits; and
   a control circuit that is responsive to either of said first or second analog circuits entering an operational state that could be affected by changes in the level of power supplied thereto, to place the other analog circuit in a state such that it presents a substantially constant demand for power on said power supply,
   wherein said other analog circuit is placed in a state that draws a maximum amount of current from the power supply.

2. An analog-to-digital conversion system, comprising:
   a pair of analog-to-digital converters that each receive power from a common power supply; and
   a controller that detects when either of said analog-to-digital converters is triggered to perform a conversion operation, and places the other of said analog-to-digital converters in an active state to draw a maximum amount of current from said power supply.

3. The conversion system of claim 2, wherein each of said analog-to-digital converters comprises a chopper circuit.

4. The conversion system of claim 3, wherein said controller is responsive to a nulling operation occurring on one of said chopper circuits to initiate a nulling operation on the other chopper circuit.

5. The conversion system of claim 3, wherein said controller is responsive to a conversion operation being performed by one of said chopper circuits to initiate a nulling operation on the other chopper circuit.

6. A method for controlling a pair of analog-to-digital conversion circuits that share a common power supply, comprising the following steps:
   detecting that a signal is being applied to one of said circuits to cause a conversion operation to be performed; and
   generating a signal that activates the other circuit to draw a maximum amount of current from the power supply while the conversion operation is being performed by said one circuit.

7. The method of claim 6 wherein said conversion circuits comprise chopper circuits, and said generated signal places said other circuit in a nulling phase of operation.

* * * * *